United States Patent
Sanchez Ruiz et al.

(10) Patent No.: US 10,520,539 B2
(45) Date of Patent: Dec. 31, 2019

(54) SYSTEM FOR DETECTING AND INDICATING PARTIAL DISCHARGES AND VOLTAGE IN HIGH-VOLTAGE ELECTRIC POWER DISTRIBUTION SYSTEMS

(71) Applicant: Ormazabal Protection & Automation, S.L.U., Igorre (ES)

(72) Inventors: Juan Antonio Sanchez Ruiz, Igorre (ES); Jagoba Perez Martinez, Igorre (ES); Jose Maria Rua Sanchez, Igorre (ES); Ian Gilbert, Amorebieta (ES); Aritz Hurtado Vicuña, Amorebieta (ES); Patrick Mulroy, Amorebieta (ES)

(73) Assignee: Ormazabal Protection & Automation, S.L.U., Igorre, Vizcaya (ES)

( * ) Notice: Subject to any disclaimer, the term of this patent is extended or adjusted under 35 U.S.C. 154(b) by 59 days.

(21) Appl. No.: 15/832,466

(22) Filed: Dec. 5, 2017

(65) Prior Publication Data

US 2018/0156857 A1 Jun. 7, 2018

Related U.S. Application Data

(63) Continuation of application No. PCT/ES2015/070447, filed on Jun. 5, 2015.

(51) Int. Cl.
*H01H 31/12* (2006.01)
*G01R 31/02* (2006.01)
(Continued)

(52) U.S. Cl.
CPC ......... *G01R 31/024* (2013.01); *G01R 31/086* (2013.01); *G01R 31/1245* (2013.01); *G01R 31/1272* (2013.01)

(58) Field of Classification Search
CPC .... G01R 31/025; G01R 31/024; G01R 31/08; G01R 15/142; G01R 31/021; G01R 31/086; G01R 31/3272; G01R 31/40; G01R 31/085; G01R 31/11; G01R 1/00; G01R 22/063; G01R 29/0814; G01R 31/02;
(Continued)

(56) References Cited

U.S. PATENT DOCUMENTS 8,294,477 B2 * 10/2012 Handshoe .......... G01R 27/2605
324/126
9,753,080 B2 * 9/2017 Andle ................ G01R 31/1272

FOREIGN PATENT DOCUMENTS

| CN | 203773010 U | 8/2014 |
| EP | 0851442 B1 | 2/2004 |
| EP | 2725367 A1 | 4/2014 |

OTHER PUBLICATIONS

IPRP with Written Opinion and International Search Report for Application No. PCT/ES2015/070447 dated Sep. 20, 2017.
(Continued)

*Primary Examiner* — Vinh P Nguyen
(74) *Attorney, Agent, or Firm* — Jenkins, Wilson, Taylor & Hunt, P.A.

(57) ABSTRACT

A system for detecting and indicating partial discharges and voltage. The system allows capturing signals from the electric power system and/or the electrical equipment thereof, and detecting and indicating the presence or absence of partial discharges and voltage, which allows carrying out a quick and simple inspection in order to prevent faults in the distribution elements, preventing risks and performing suitable installation maintenance.

9 Claims, 4 Drawing Sheets

(51) Int. Cl.
*G01R 31/12* (2006.01)
*G01R 31/08* (2006.01)

(58) Field of Classification Search
CPC ...... G01R 31/06; G01R 31/12; G01R 31/327; G01R 31/346; H01H 33/666; H02H 7/04
See application file for complete search history.

(56) References Cited

OTHER PUBLICATIONS

Steiner, "Partial Discharge—Part IV: Commercial PD Testing," IEEE Electrical Insulation Magazine, vol. 7, No. 1, XP011418578, ISSN: 0883-7554, DOI: 10.1109/57.64967, pp. 20-33, dated Jan. 1, 1991.
Petkovic, et al., "Measuring System for Partial Discharge," Joint Proceedings of the IEEE Instrumentation and Measurement Technology Conference and the IMEKO Technical Committee, Brussels, Jun. 4-6, 1996, vol. 1, XP000640310, ISBN: 978-0-7803-3313-0, pp. 426-429, dated Jun. 4, 1996.

\* cited by examiner

SYSTEM FOR DETECTING AND INDICATING PARTIAL DISCHARGES AND VOLTAGE IN HIGH-VOLTAGE ELECTRIC POWER DISTRIBUTION SYSTEMS

CROSS-REFERENCE TO RELATED APPLICATION

This application claims the benefit of and priority to PCT/ES2015/070447, filed on Jun. 5, 2015, the entire disclosure of which is incorporated by reference herein.

TECHNICAL FIELD

The present disclosure relates to a system based on capturing, detecting and indicating signals from the electric power system and/or the electrical equipment thereof, and more specifically on detecting and indicating partial discharges, the main objective of the present disclosure being to provide an indicator which allows the verification of the absence or presence of partial discharges in a simple manner in an installation, visually and/or audibly.

BACKGROUND

In most cases, partial discharge phenomena are due to insulation defects in the distribution elements forming part of the electric power distribution system, the distribution elements consisting of, for example, cables, transformers, switches, electrical connections, etc.

Partial discharges have damaging effects on the medium in which they occur. In a solid or liquid medium, they cause a slow but continuous degradation, ending with the dielectric breakdown of the insulating medium. In a gaseous medium, such as for example, air, partial discharges cause the known corona effect, which comprises consequences directly perceivable by sense of sight, hearing or smell. However, there are other consequences that are not detectable in a simple manner, such as heat generation, power losses, mechanical erosion of ionically bombarded surfaces, interferences with radio waves, etc.

Partial discharges can have very serious consequences if they occur and go unnoticed. If the problem remains unsolved, deterioration will occur until the distribution element is completely destroyed. Replacing or repairing the damaged distribution element can be very costly and can involve a power cut in the distribution system for a long period of time, as well as significant economic losses for electric utilities. The key for preventing any possible problem is to detect and indicate partial discharges. An early detection and, accordingly, indication of partial discharges can aid in preventing risks and performing suitable installation maintenance.

Ultimately, it is important to inspect the presence or absence of partial discharges and prevent faults in the distribution elements, such as for example, in cables, as well as prevent economic losses for electric utilities, service cuts to consumers involving long periods until the system is re-established, etc.

Physical systems comprising sensors for capturing signals to be measured, devices for recording the signals, means for transmitting the signals, devices for storing information, means for processing the results, etc., are used to carry out an evaluation of the state of insulation. In this sense, there are monitoring systems which are used to perform periodic or continuous evaluations of the electric power distribution system and of the distribution elements forming part of the system. However, on the other hand, there are no systems or devices which allow detecting and indicating partial discharges and which are integrated in the corresponding electrical equipment forming part of the installations (such as for example, in an electric transformation substation), and which are continuously indicating the presence or absence of partial discharges verifying the presence or absence of the partial discharges in a simple manner, such as for example, visually and/or audibly. Installations with this type of mentioned systems which allow early detection and accordingly indicating/visualizing the existence of partial discharges in a simple manner without having to use other devices, systems, etc., external to the installation are not known, which can lead to there still being partial discharges that are not detected in time, and to the undetected partial discharges causing adverse effects such as those mentioned above.

Patent document CN203773010U which mentions a solution relating to a partial discharge monitoring instrument in electric cubicles, which comprises a central processing unit, a partial discharge signal processing circuit, a partial discharge indicating circuit, etc., can be mentioned as an example. This solution relates to a system or instrument which is used for performing a continuous or periodic evaluation of the state of insulation or of the system, which involves functions such as measuring partial discharges, locating the position of the discharges in the system, identifying the partial discharges, recording or storing data, communications (alarms, state of insulation, etc.), control functions, etc., in addition to indicating the presence of partial discharges. Therefore, it does not relate to a system for detecting and indicating partial discharges which allows a quick and simple verification of the presence or absence of the discharges, such as for example, the verification that could be performed by an operator by simply entering an installation such as an electric transformation substation, but rather relates to a more complex and expensive system which is used for evaluating the system or the state of insulation once partial discharges are detected.

On the other hand, capturing voltage signals through screens incorporated in the bushings of the electrical equipment, such as for example, electric cubicles, transformers, etc., is known. These captured voltage signals allow carrying out applications, such as for example, detecting, measuring and indicating voltage, sometimes using more than one screen for capturing the voltage signals, i.e., one screen for each of the applications. In this sense, patent EP0851442B1 is known, which describes a bushing incorporating two screens, one of them capturing a voltage signal for voltage detection application and the other capturing a voltage signal for voltage measurement, so it is based on the use of two different voltage signals one for each of the applications, this significantly increasing its complexity and associated costs.

Furthermore, referring to non-patent literature, it is known the article of J. P. Steiner: "*Partial Discharge—Part IV: Commercial PD testing*" (1991, IEEE), which is concerned with commercial applications of partial discharge testing.

SUMMARY

The system for detecting and indicating partial discharges and voltage of the present disclosure is based on capturing, detecting and indicating signals from the electric power system and/or the electrical equipment thereof, such as for example, electric cubicles, transformers, etc., which, by integrating the system in all or in part of the mentioned electrical equipment, allows the verification of the presence or absence of partial discharges in a quick and simple manner, such as for example, visually and/or audibly.

This system for detecting and indicating partial discharges comprises:
- at least one capacitive voltage tap of the electrical equipment;
- at least a first circuit for measuring/detecting and indicating the presence/absence of voltage, and
- at least a second circuit for detecting and indicating partial discharges The capacitive voltage tap, the first circuit and the second circuit mentioned above are electrically connected, the first and second circuit using the voltage signal obtained through the capacitive voltage tap, such that both the presence/absence of voltage and the presence/absence of partial discharges in the installation can be indicated by capturing a voltage signal through the capacitive tap, preventing risks and, since an early detection and indication of partial discharges is available, performing suitable installation maintenance.

Ultimately, the system, object of the disclosure herein, allows inspecting the presence or absence of partial discharges and preventing faults in the distribution elements, such as for example, in cables, electrical connections, etc.

The voltage signal is captured through the capacitive voltage tap which is integrated in at least one bushing of at least one piece of electrical equipment, being a single screen inserted in the bushings and commonly used for indicating or detecting the presence/absence of voltage.

The second circuit for detecting and indicating partial discharges is arranged between the capacitive voltage tap provided by the screen of the bushing and the first circuit for measuring/detecting and indicating the presence/absence of voltage, or after the first circuit, and comprises elements that do not affect or interrupt the circuit for measuring/detecting and indicating the presence/absence of voltage, such as for example, a low-voltage transformer, which in the event of a possible failure in the second circuit for detecting and indicating partial discharges would allow maintaining the circuit for measuring/detecting and indicating the presence/absence of voltage, circuit which constitutes a safety element for the operators. The use of two different voltage signals for both applications can therefore be avoided, which entails avoiding the use of two screens in the bushings. Furthermore, standard bushings facilitating the engineering thereof and allowing customization of the electrical equipment in its final production step can be used in the present disclosure, simplifying and favouring relatively regular and planned production of electrical equipment.

On the other hand, as it relates to a system which is integrated in the corresponding electrical equipment of the installation and calibrated in the factory, the need to perform on-site wiring, such as the wiring between the circuit for detecting and indicating partial discharges and the circuit for measuring/detecting and indicating the presence/absence of voltage, is prevented.

The first circuit for measuring/detecting and indicating the presence/absence of voltage comprises at least one voltage measuring element (such as for example, a low-voltage transformer) which, given that the signal obtained from the bushings is very weak, allows a reliable voltage measurement for other applications different from the object of the present disclosure (such as for example, single-pole voltage measurement, energy measurement, power measurement, etc.), and at least one voltage signal detector and indicator for detecting and indicating voltage signal for which the voltage signal obtained from the bushings is sufficient, the voltage measuring element being able to be galvanically insulated from the capacitive voltage tap. The second circuit for detecting and indicating partial discharges can therefore be connected to the voltage measuring element or to the voltage signal detector and indicator, the voltage signal being able to be acquired through the voltage measuring element or the voltage signal detector and indicator.

Based on this acquired voltage signal, the second circuit for detecting and indicating partial discharges performs the analogue amplification of the voltage signal for adapting the signal levels to the electronics and converts the analogue signal from negative values to positive values by at least one signal amplifying/rectifying element, converts the maximum magnitude of each signal peak to a continuous level signal by at least one peak detector element and/or allows the integration of the electric signal by at least one integrator element obtaining the repetition rate of the partial discharge pulses, such that the system object of the disclosure herein can detect and indicate the presence or absence of partial discharges.

The first circuit for measuring/detecting and indicating the presence/absence of voltage and the second circuit for detecting and indicating partial discharges are preferably integrated in one and the same casing which is in turn integrated in the electrical equipment, such as for example, in an electric cell. This casing comprises at least one display which indicates the presence or absence of partial discharges, which thus allows performing a quick inspection, and therefore, aiding in preventing risks and performing suitable installation maintenance. In this case, the second circuit for detecting and indicating partial discharges is self-powered by the capacitive voltage tap or by at least another internal power supply source inside the electrical equipment. The mentioned display can also indicate the presence or absence of voltage in the installation.

The possibility that the first circuit for measuring/detecting and indicating the presence/absence of voltage being able to be integrated in a first casing, with its respective display, and that the second circuit for detecting and indicating partial discharges being able to be integrated in a second casing, also with its respective display, has been contemplated. In this case, the first circuit for measuring/detecting and indicating the presence/absence of voltage is integrated in the electrical equipment, such as for example, in an electric cell, inside the first casing. Therefore, the second circuit for detecting and indicating partial discharges incorporated inside the second casing is portable and can be connected to the first circuit for measuring/detecting and indicating the presence/absence of voltage through the first casing integrated in the electrical equipment. In this case, the second circuit for detecting and indicating partial discharges is powered through a battery or any other external power supply source. Furthermore, in this case in which the second circuit for detecting and indicating partial discharges is incorporated inside the second casing, a third phase comparing circuit can be arranged inside this same second casing which, regardless of the second circuit for detecting and indicating partial discharges, can indicate the phase concordance between electrical equipment.

In any of the preceding cases, the system for detecting and indicating partial discharges and voltage object of the present disclosure can allow verification in a simple manner (visually and/or audibly) the presence or absence of partial discharges and voltage both locally and remotely. The system for detecting and indicating partial discharges and voltage can therefore comprise at least one communications outlet for the case of remote verification.

Finally, the possibility of being able to have a first circuit for measuring/detecting and indicating the presence/absence of voltage and an independent circuit for detecting and indicating partial discharges for each of the phases of the electrical equipment has been contemplated, the identification of the phase in which the partial discharge has been detected being possible in this case.

DETAILED DESCRIPTION

Several preferred embodiments are described below in reference to the aforementioned drawings, without limiting or reducing the scope of protection of the present disclosure.

Figure 1:
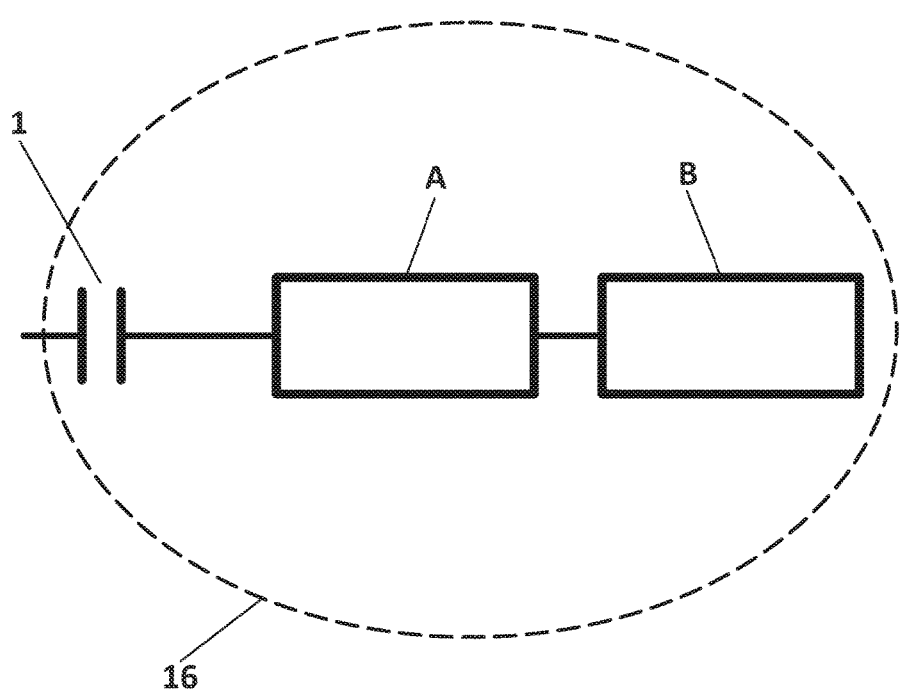
FIG. 1 shows a block diagram of the system for detecting and indicating partial discharges and voltage of the disclosure herein.

FIG. 1 shows a block diagram reflecting the system (16) for detecting and indicating partial discharges and voltage, object of the present disclosure. The system (16) comprises at least one capacitive voltage tap (1), at least a first circuit (A) for measuring/detecting and indicating the presence/absence of voltage and at least a second circuit (B) for detecting and indicating partial discharges, the three blocks being electrically connected. The capacitive voltage tap (1) provides the voltage signal for the first circuit (A) and for the second circuit (B), such that starting from this voltage signal, the system (16) can indicate the presence or absence of voltage and/or the presence or absence of partial discharges.

Figure 5:
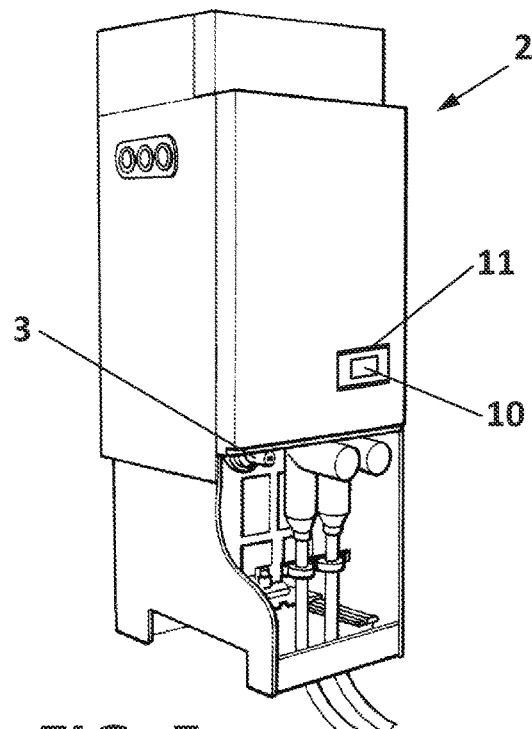
FIG. 5 shows a perspective view of electrical equipment comprising the system for detecting and indicating partial discharges and voltage integrated therein.
Figure 6:
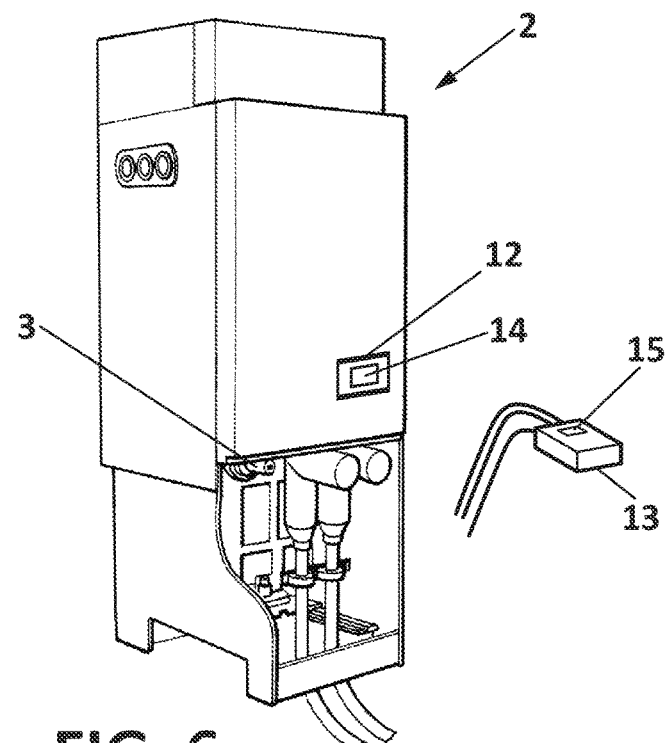
FIG. 6 shows a perspective view of electrical equipment comprising, integrated therein, the first circuit for measuring/detecting and indicating the presence/absence of voltage inside a first casing, whereas the second circuit for detecting and indicating partial discharges incorporated inside a second casing is shown as a portable element.

As mentioned, the voltage signal is captured through a capacitive voltage tap (1) which is integrated in at least one bushing (3) of at least one piece of electrical equipment (2), as can be seen in FIGS. 5 and 6.

Figure 2:
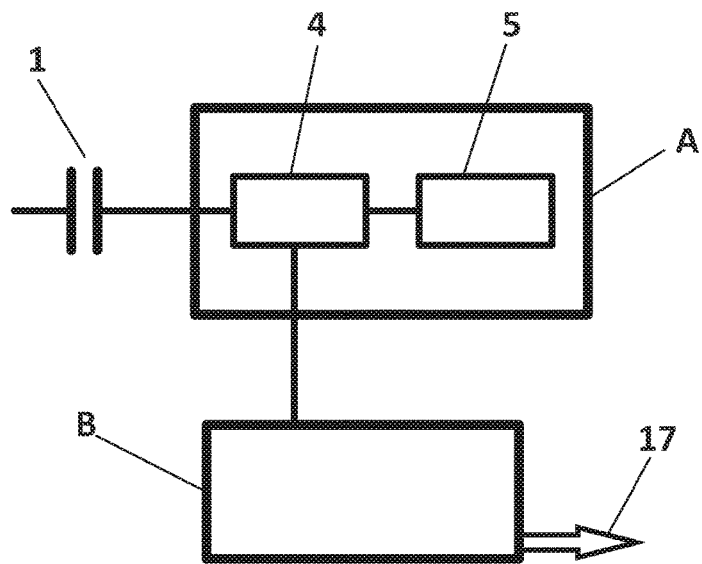
FIG. 2 shows a block diagram of the system for detecting and indicating partial discharges and voltage according to a first embodiment of the disclosure herein.

According to a first embodiment of the disclosure herein shown in FIG. 2, the first circuit (A) for measuring/detecting and indicating the presence/absence of voltage comprises at least one voltage measuring element (4), such as for example, a low-voltage transformer, and also comprises at least one voltage signal detector and indicator (5) that can detect and indicate voltage signal. According to this first embodiment, the second circuit (B) for detecting and indicating partial discharges is connected to the voltage measuring element (4).

Figure 3:
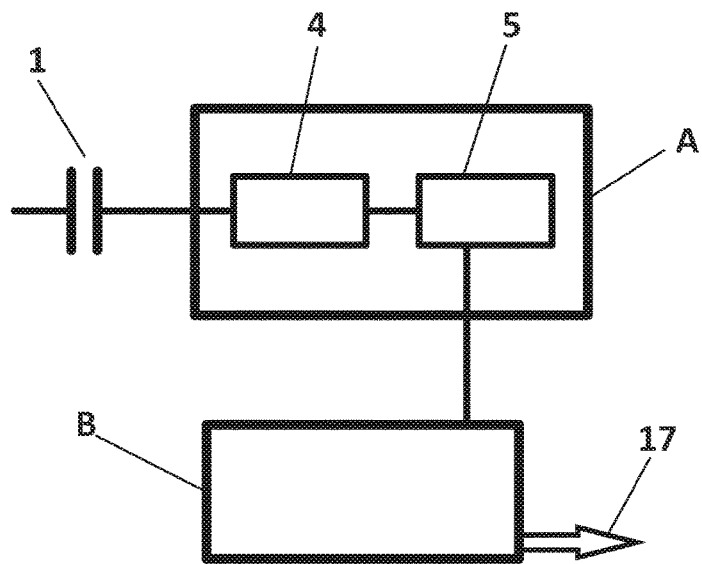
FIG. 3 shows a block diagram of the system for detecting and indicating partial discharges and voltage according to a second embodiment of the disclosure herein.

According to a second embodiment of the disclosure herein shown in FIG. 3, the first circuit (A) for measuring/detecting and indicating the presence/absence of voltage comprises at least one voltage measuring element (4), such as for example, a low-voltage transformer, and also comprises at least one voltage signal detector and indicator (5) that can detect and indicate voltage signal. According to this second embodiment, the second circuit (B) for detecting and indicating partial discharges is connected to the voltage signal detector and indicator (5).

Figure 4A:
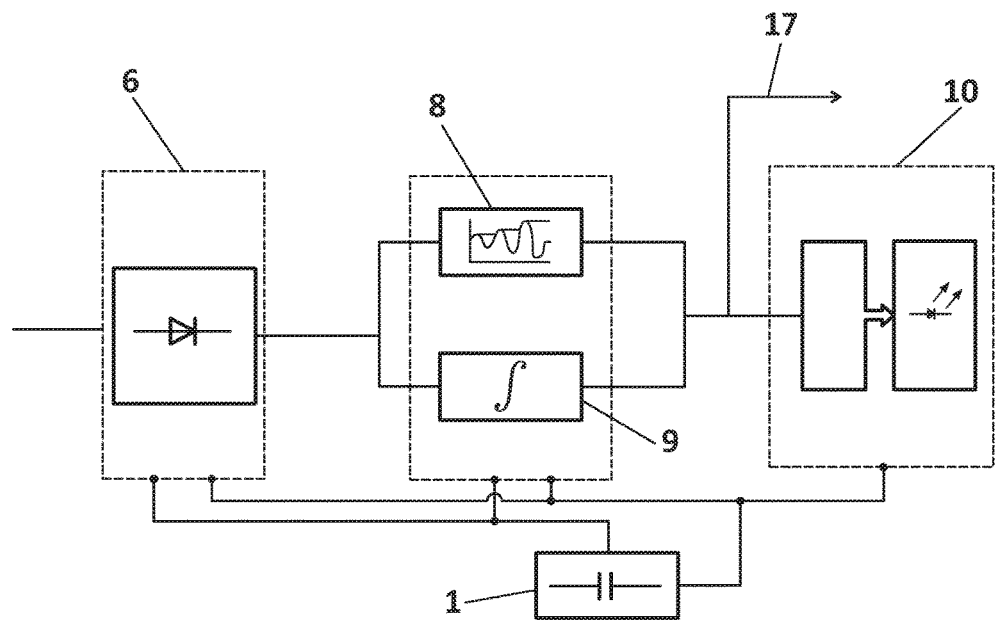
FIG. 4a shows a block diagram of the circuit for detecting and indicating partial discharges, self-powered by a capacitive voltage tap.
Figure 4B:
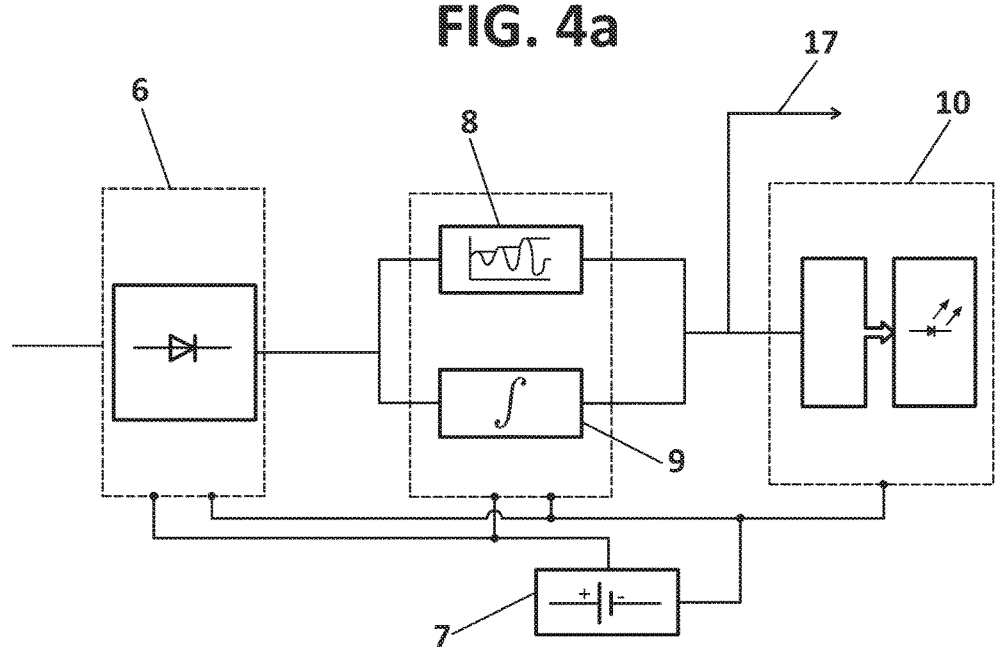
FIG. 4b shows a block diagram of the circuit for detecting and indicating partial discharges, powered through a battery or any other external power supply source.

In both embodiments of the disclosure herein, the second circuit (B) comprises at least one signal amplifying/rectifying element (6), at least one peak detector element (8) and/or at least one integrator element (9), as shown in FIGS. 4a and 4b.

As can be seen in FIG. 5, the system (16) of the disclosure herein is integrated in the electrical equipment (2), such as for example, an electric cell. In this sense, the first circuit (A) and the second circuit (B) are incorporated inside one and the same casing (11), which is in turn integrated in the electrical equipment (2) as shown in FIG. 5. The casing (11) comprises at least one display (10) indicating the presence or absence of partial discharges, indicating the presence or absence of voltage in the installation also being possible. In this case, the second circuit (B) for detecting and indicating partial discharges is self-powered by the capacitive voltage tap (1), as shown in FIG. 4a, or by at least another internal power supply source inside the electrical equipment (2).

On the other hand, the possibility that the first circuit (A) is being incorporated in a first casing (12) and the second circuit (B) is being incorporated in a second casing (13) has also been contemplated, each of these casings (12, 13) comprising its own display (14, 15), respectively, as shown in FIG. 6. The first casing (12) is thus integrated in the electrical equipment (2), and therefore, the first circuit (A) is also integrated in the electrical equipment (2), whereas the second casing (13) incorporating the second circuit (B) is independent of the electrical equipment (2), designed as a portable element which can be connected to the casing (12) for detecting and indicating the presence or absence of partial discharges. In this case, the second circuit (B) is powered through a battery or any other external power supply source (7) outside the electrical equipment (2), as shown in FIG. 4b.

Finally, as shown in FIGS. 2, 3, 4a and 4b, the system (16) herein described can comprise at least one communications outlet (17) which allows remote and easy (visually and/or audibly) verification of the presence or absence of partial discharges and voltage in the installation.

The invention claimed is:

1. A system for detecting and indicating partial discharges and voltage in a high-voltage electric power distribution system, or an installation, which includes electrical equipment, the system comprising:
   a) at least one capacitive voltage tap integrated in the electrical equipment and configured to capture signals from the power distribution system;
   b) at least a first circuit integrated in the electrical equipment and configured for measuring/detecting and indicating presence or absence of voltage in the power distribution system; and
   c) at least a second circuit for detecting and indicating partial discharges, electrically connected to the capacitive voltage tap and to the first circuit for measuring or detecting and indicating a presence or an absence of voltage;

wherein the system is configured for the capacitive voltage tap to provide the voltage signal for the first circuit and for the second circuit, such that starting from the voltage signal, the system indicates the presence or absence of voltage and/or the presence or absence of partial discharges;

wherein the capacitive voltage tap is integrated in at least one bushing of the electrical equipment;

wherein the first circuit comprises at least one voltage measuring element and at least one voltage signal detector and indicator;

wherein the second circuit is connected to the voltage measuring element or to the voltage signal detector and indicator; and wherein the second circuit for detecting and indicating partial discharges comprises at least one signal amplifying or rectifying element, at least one peak detector element and/or at least one integrator element.

2. The system according to claim 1, wherein the voltage measuring element is galvanically insulated from the capacitive voltage tap.

3. The system according to claim 1, wherein the first circuit and the second circuit are integrated in a same casing comprising at least one display, the casing being integrated in the electrical equipment.

4. The system according to claim 3, wherein the second circuit is self-powered by the capacitive voltage tap.

5. The system according to claim 4, wherein the second circuit is powered through a battery or any other external power supply source outside the electrical equipment.

6. The system according to claim 4, further comprising a third phase comparing circuit arranged inside the second casing which, regardless of the second circuit for detecting and indicating partial discharges, is configured for indicating a phase concordance between electrical equipment.

7. The system according to claim 1, wherein the first circuit for measuring or detecting and indicating the presence or absence of voltage is integrated in a first casing comprising at least one display, and the second circuit for detecting and indicating partial discharges is integrated in a second casing comprising at least another display, the first casing being integrated in the electrical equipment.

8. The system according to claim 1, comprising at least one communications outlet for remote verification of the absence or presence of partial discharges and voltage in the installation.

9. The system according to claim 1, comprising a first circuit for measuring or detecting and indicating the presence or absence of voltage and a second independent circuit for detecting and indicating partial discharges for each of the phases of the electrical equipment.

* * * * *